United States Patent [19]

Pisati et al.

[11] Patent Number: 5,621,358

[45] Date of Patent: Apr. 15, 1997

[54] TRANSCONDUCTOR STAGE WITH CONTROLLED GAIN

[75] Inventors: Valerio Pisati, Bosnasco; Roberto Alini, Stradella; Rinaldo Castello, Arcore; Gianfranco Vai, Pavia, all of Italy

[73] Assignee: SGS-Thomson Microelectronics, S.r.l., Agrate Brianza, Italy

[21] Appl. No.: 454,924

[22] Filed: May 31, 1995

[30] Foreign Application Priority Data

Jul. 29, 1994 [EP] European Pat. Off. .............. 94830390

[51] Int. Cl.$^6$ .................................................. H03F 3/45
[52] U.S. Cl. .......................................... 330/253; 330/254
[58] Field of Search .................................. 330/253, 254, 330/259, 261, 300

[56] References Cited

U.S. PATENT DOCUMENTS

| | | | |
|---|---|---|---|
| 4,342,005 | 7/1982 | Harford | 330/254 |
| 5,057,787 | 10/1991 | Arai et al. | 330/254 |
| 5,212,455 | 5/1993 | Pernici et al. | 330/253 |

FOREIGN PATENT DOCUMENTS

| | | |
|---|---|---|
| 0561099 | 9/1993 | European Pat. Off. . |
| 1137810 | 8/1989 | Japan . |

OTHER PUBLICATIONS

J. H. Huijsing et al., "Low-Voltage Operational Amplifier with Rail-to-Rail Input and Output Ranges," IEEE Journal of Solid-State Circuits, vol. SC-20, No. 6, p. 1144 (1985).

*Primary Examiner*—Steven Mottola
*Attorney, Agent, or Firm*—Robert Groover; Betty Formby; Matthew Anderson

[57] ABSTRACT

A controlled gain transconductor (20) which comprises a transconductance stage (3) having at least two input terminals (I1, I2) and at least two output terminals (O1, O2), an active load (4) connected to the output terminals of the transconductance stage and a control circuit (5) for the active load (4) connected between said output terminals (O1, O2) and the active load (4).

Also provided is a circuit portion (10) being a replica of the transconductance stage (3), the active load (4) and the control circuit (5). This replicated portion (10) has an output connected to the control circuit (5) of the transconductor (20) to provide a predetermined voltage value (Vc) required for adjusting the DC gain of the device.

32 Claims, 4 Drawing Sheets

TRANSCONDUCTOR STAGE WITH CONTROLLED GAIN

DESCRIPTION

1. Field of the Invention

This invention relates to a controlled gain transconductor comprising a transconductance stage connected between a first, supply voltage reference and a second voltage reference, with at least two input terminals and at least two output terminals.

The invention concerns in particular, but not exclusively, the implementation of filter integrators, and the description which follows will make reference to that application for convenience of illustration.

2. Background Art

A transconductor is basically a voltage-controlled, transconductance differential stage. It is used to implement integrators and active filter components, as well as oscillators and impedance transform circuits.

A practical integrator, as shown generally at 1 in FIG. 1, for example, usually comprises a transconductor stage 2 having a finite output resistance R0 connected in parallel with a load capacitance C.

The transfer function FdT of the integrator 1, i.e. the ratio of the Fourier transform of the output voltage signal Vo to the Fourier transform of the input voltage signal Vi is given by the following expression:

$$FdT = Vo/Vi = gm * R_0/(1 + j*\omega*R_0*C) \quad (1)$$

where gm is the transconductance of the transconductor 2.

The presence of even a low-value output resistance R0 makes the integrator 1 an approximate one by introducing a gain $A = gm*R_0$.

Respectively denoted by the references A and B in FIG. 2 are the frequency responses of an ideal integrator and of a real, i.e. approximate, integrator. It can be seen from the Figure that the frequency response from the real integrator shows damping at low values of the angular pulsation $\omega$. The phase of the transfer function FdT of a real integrator 1 is:

$$\phi(\omega) = -\arctan \omega*R_0*C = -\arctan \omega/\omega_D \quad (2)$$

where $\omega_D = 1/(R_0*C)$ is the pulsation corresponding to a gain $A = gm*R_0$.

At the operating pulsation, as designated $\omega_o$ and equal to the gm/C ratio, the phase $\phi$ has the following value:

$$\phi(\omega_o) = -\arctan \omega_o/\omega_D = -\arctan A \quad (3)$$

Taking into consideration the effect of a second equivalent pole as well, which is present at an equivalent pulsation of $\omega p$ and added to the pole of the ideal transconductor at the operating pulsation $\omega_o$, the transfer function of the integrator 1 may be written as:

$$Fdt = Vo/Vi = A/((1 + j*\omega/\omega_D)*(1 + j*\omega/\omega_p)) \quad (4)$$

where $A = gm*R_0$ is the gain of transconductor 2 and $\omega_D = 1/(R_0*C)$ is the corresponding pulsation to that gain.

The phase overflow of the integrator 1 is defined, at the operating pulsation $\omega_o$, by the difference:

$$\Delta\phi = \omega(\omega_o) - (-\pi/2) \quad (5)$$

Simple mathematical calculations yield the relation:

$$\Delta\phi = \arctan(\omega_D/\omega_o) - \arctan(\omega_o/\omega_p) \quad (6)$$
$$= \arctan[(1/A - \omega_o/\omega_p)/(1 + 1/A*\omega_o/\omega_p)]$$

For gains A much greater than 1 and second pole pulsations $\omega_p$ which are far apart from the operating pulsation $\omega_o$, the relation (6) is brought to the following form:

$$\Delta\phi = \arctan(1/A - \omega_o/\omega_p) \quad (7)$$

This relation (7) shows that the phase overflow $\Delta\phi$ is affected by both the variation of gain A and the frequency position of the second equivalent pole, i.e. the pulsation $\omega_p$.

Shown in FIG. 3 is the frequency response (or Bode Diagram) of a generic approximate integrator having a gain A and a second pole at pulsation $\omega_p$ (curve I).

Curve II in FIG. 3 illustrates the frequency response from the same integrator when a phase overflow occurs due to a variation in gain (from A to A'), and curve III illustrates the frequency response from an integrator wherein the gain A and the second pole $\omega_p$ vary by the same amount in percent.

Curve III shows the same phase overflow $\Delta\phi$ as curve I at the operating pulsation $\omega_o$.

Leaving out the contribution from the second pole at pulsation $\omega_p$, the expression for the phase overflow $\Delta\phi$, at gains A well above unity, reduces to:

$$\Delta\phi = 1/A \quad (8)$$

It can be appreciated from expression (8) that deviations of the gain A from a designed value result in variations of the phase overflow $\Delta\phi$ at the pulsation $\omega_o$, with unity integrator gain.

Furthermore, where the integrator 1 is employed in the design of filters, the variations of the phase overflow may lower the accuracy of the so-called quality factor Q of a biquadratic cell—an essential part to the implementation of filters, although not described herein because known per se.

Finally, the presence of a finite resistance $R_0$ brings about an attenuation in the input-output gain G of the above biquadratic cell.

Therefore, this gain error $\Delta G$ must be compensated for at the designing stage to provide the ideal gain sought.

In order to restrain the phase overflows $\Delta\phi$—which, as previously mentioned, are inversely proportional to the gain A of the integrator 1—one could think of providing an integrator 1 having a particularly high gain A. In this way, variations in the gain A would induce phase overflows of negligible magnitude.

But this would actually imply a transconductor design having high output resistances $R_0$, which is difficult to implement with certain high frequency technologies disallowing the use of transistors of the vertical pnp type.

The same problem is encountered when technologies for low supply voltages are employed, where PMOS transistors in a cascode configuration cannot be used for the active load.

A second design strategy currently employed provides for the designing of an integrator 1 with a low-value center or "nominal" gain, that is a controlled type of gain for deviations from its nominal value. In this way, those gain A variations on which the phase overflow $\Delta\phi$ is dependent can be cancelled as best as possible.

Moreover, with the gain limited to within two values, Amin and Amax, a biquadratic cell of a filter with the following "nominal" gain can be provided:

$$Anom=2/(1/Amin+1/Amax) \quad (9)$$

thereby to achieve minimization of the gain error ΔG.

By employing low gain integrators and cells, simpler active loads and circuit topologies which operate on a low supply can be used.

To obtain a nearly constant gain A, the prior art has proposed that a load L be used which varies according to the variations in the transconductance gm of the transconductance stage 3.

This objective is attained by using a load L controlled by a voltage equal to A/gm, as explained by Baschirotto, Rezzi, Castello and Alini in "Design of High-frequency BiCMOS continuous-time filters with low-output impedance transconductor".

Since the transconductance of the stage 3 and the load L vary in the same direction, the gain A will not vary with such electrical parameters as the voltage and current levels.

A varying load L of transconductance $g_L$ is provided by using CMOS complementary field-effect transistors. The transconductor 2 gain becomes:

$$A=gm/g_L=2/\alpha \quad (10)$$

where α is the fractional current flowing through the CMOS transistors that make up the load L.

As practiced, this solution fails to remove the gain variation with the process parameters that affect, in particular, the implementation of the complementary CMOS transistors. This solution also requires compensation circuitry, as described in European Patent Application No. 92830140.7 by the Applicant.

The technical problem which underlies this invention relates to the provision of a transconductor stage having such structural and functional features as to produce a controlled-gain integrator, regardless of operation or process conditions, thereby overcoming the above-mentioned limitations which beset the prior art.

SUMMARY OF THE INVENTION

The solutive idea on which the invention stands is one of controlling the gain of the integrator, incorporating a transconductor, by varying the output resistance of the active load.

Based on this solutive idea, the technical problem is solved by a transconductor stage as indicated being characterized in that it comprises an active load controlled by a control circuit, said active load and said control circuit being connected to each other and to the outputs of the transconductance stage.

The features and advantages of a transconductance stage according to the invention will be apparent from the following detailed description of an embodiment thereof, to be taken by way of example only with reference to the accompanying drawings.

DETAILED DESCRIPTION

Figure 1:
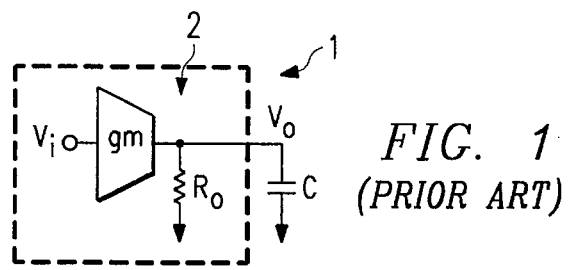
FIG. 1 shows an integrator with a transconductor incorporated thereto, according to the prior art.
Figure 2:
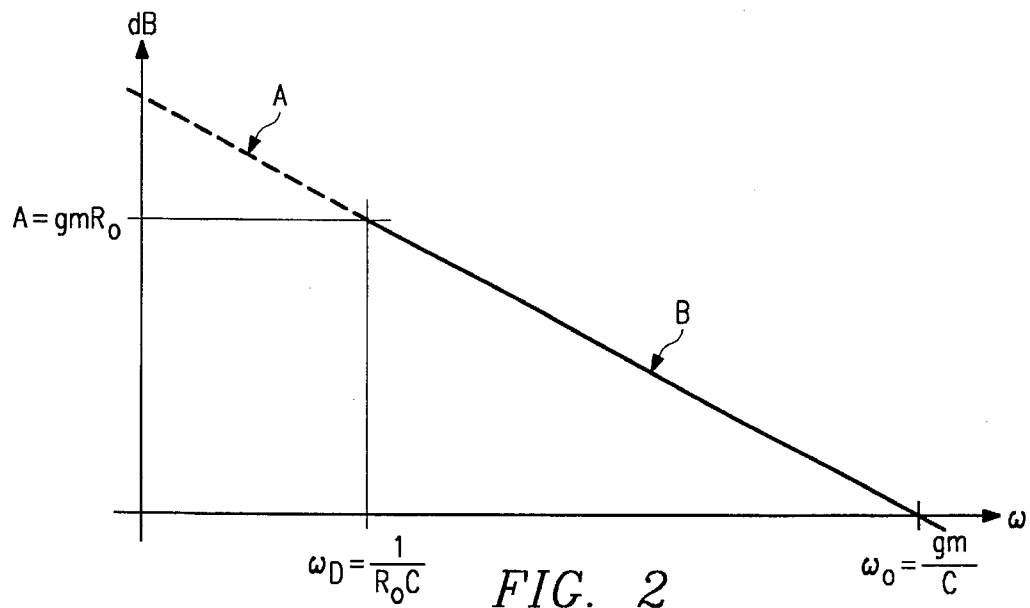
FIG. 2 shows respective ideal and real frequency responses from the integrator in FIG. 1.
Figure 3:
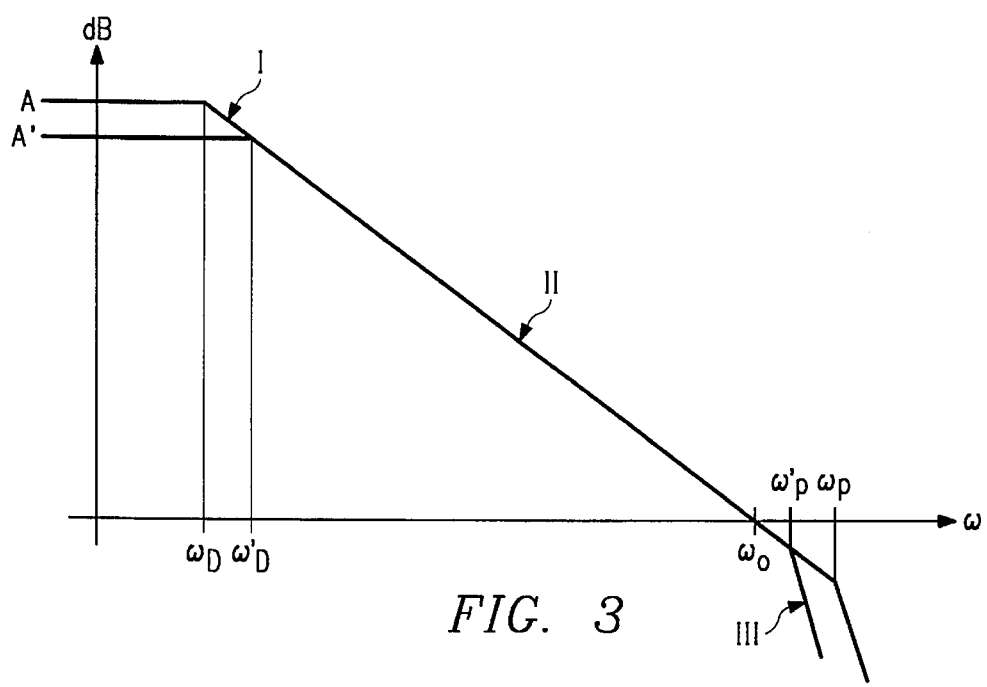
FIG. 3 shows frequency responses from the integrator in FIG. 1, when gain and pulsation variations of a second pole are encountered.
Figure 4:
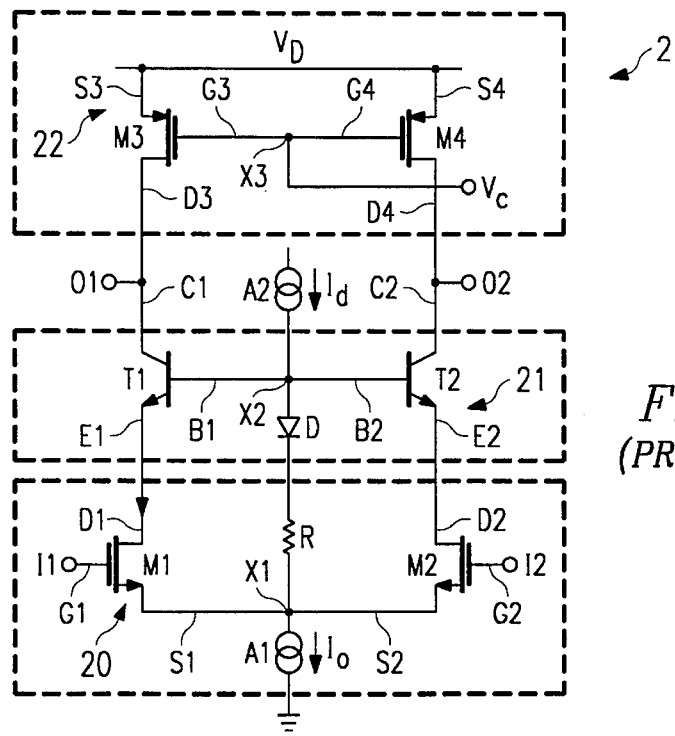
FIG. 4 shows in greater detail a transconductor stage according to the prior art.

With reference to the drawing figures, and to FIG. 4 in particular, a conventional transconductor is shown generally and schematically at 2 which comprises a first or input circuit portion 20.

This input circuit portion 20 comprises a pair of n-channel MOS transistors M1 and M2 having their source terminals S1 and S2 merged into a first common terminal X1.

The common terminal X1 is connected toward ground through a first generator A1 of a current Io.

The gate terminals G1 and G2 of the MOS transistors, respectively M1 and M2, form the input terminals $IN_1$ and $IN_2$ of the transconductor 2.

The first or input circuit portion 20 is connected to a second or output circuit portion 21 comprised of a pair of bipolar transistors T1 and T2.

Specifically, the drain terminals D1 and D2 of the MOS transistors M1 and M2 are connected to the emitter terminals E1 and E2 of the bipolar transistors T1 and T2.

The base terminals B1 and B2 of these bipolar transistors T1 and T2 are joined together into a second common terminal X2.

A diode D and a resistive bias element R, in series with each other, are connected between the second X2 and the first X1 terminals. To the second terminal X2, a second generator A2 of a current Id, referred to as the tuning current, is also connected.

The collector terminals C1 and C2 of the bipolar transistors T1 and T2 are the output terminals O1 and O2 of the transconductor 2 and connected to the drain terminals D3 and D4 of further MOS transistors M3 and M4, of the p-channel type, which are part of a third or bias circuit portion 22.

The transistors M3 and M4 are connected to each other into a current mirror configuration, with the terminals S3 and S4 connected to a supply voltage reference VD and the gate terminals G3 and G4 connected together into a third common terminal X3 which is applied a control voltage Vc.

As a first approximation, the expression for the gain A of the transconductor 2 in FIG. 4 is as follows:

$$A=gm_{NMOS}/gds_{PMOS} \quad (11)$$

where:

—$gm_{NMOS}$ is the transconductance of the n-channel MOS transistors M1 and M2, as given by, $$gm_{NMOS}=I_M/|(Vgs-Vth)-Vds_{NMOS}/2)| \quad (12)$$

in which Vgs is the gate-source voltage, Vth is the threshold voltage, $Vds_{NMOS}$ is the drain-source voltage of the transistors M1 and M2 themselves, and $I_M$ is the current flowing therethrough;

—$gds_{PMOS}$ is the drain-source conductance of the p-channel MOS transistors M3 and M4, as given by, $$gds_{PMOS}=\lambda*I_M/(1+\lambda*Vds_{PMOS}) \quad (13)$$

in which $\lambda$ is the channel modulation coefficient, $Vds_{PMOS}$ is the drain-source voltage of the MOS transistors M3 and M4 themselves, and $I_M$ is the current flowing through the transistors M1 and M2.

Since the voltage $Vfs_{NMOS}$ of the transistors M1 and M2 is tied to the tuning current Id, the gain A is also bound to depend on this current.

On the other hand, $Vds_{PMOS}$ is held constant by the circuit that sets the common mode output voltage.

Figure 5:
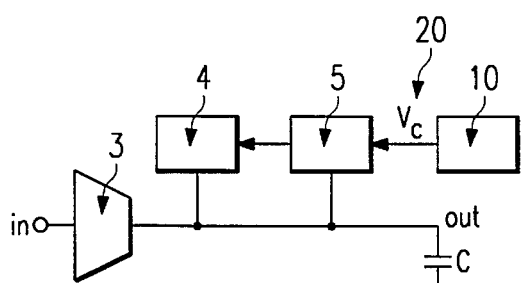
FIG. 5 shows schematically a controlled gain transconductor embodying this invention.

Shown more schematically at 20 in FIG. 5 is the controlled-gain transconductor of this invention.

The transconductor 2 comprises a transconductance stage 3, an active load 4, and a control circuit 5, as well as a capacitor C connected between the output of the transconductance stage 3 and a voltage reference, such as a signal ground (GND).

The active load 4 and control circuit 5 are connected in parallel between the output of the transconductance stage 3 and the capacitor C.

The active load 4 is implemented by a double load circuit 8, 9, specifically by a double pair of MOS transistors M13+M14 and M15+M16, all of the p-channel type.

Figure 6:
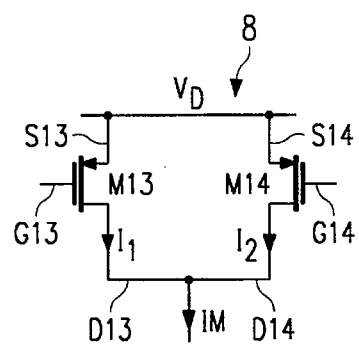
FIG. 6 shows in greater detail a portion of the transconductor in FIG. 5.

Only one of the two transistor pairs is shown in FIG. 6, namely pair 8 comprised of the transistors M13 and M14. The source terminals S13 and S14 are connected to the supply voltage reference $V_D$. The drain terminals D13 and D14 are connected to each other.

These MOS transistors, M13 and M14, have currents $I_1$ and $I_2$, respectively, flowed therethrough, and are characterized by different channel lengths $L_1$ and $L_2$.

The configuration in FIG. 6 has a drain-source conductance gds given by:

$$gds=\lambda(L_1)*I_{M1}/(1+\lambda(L_1)*Vds_{PMOS})++\lambda(L_2)*I_{M2}/(1+\lambda(L_2)*Vds_{PMOS}) \quad (14)$$

Figure 7:
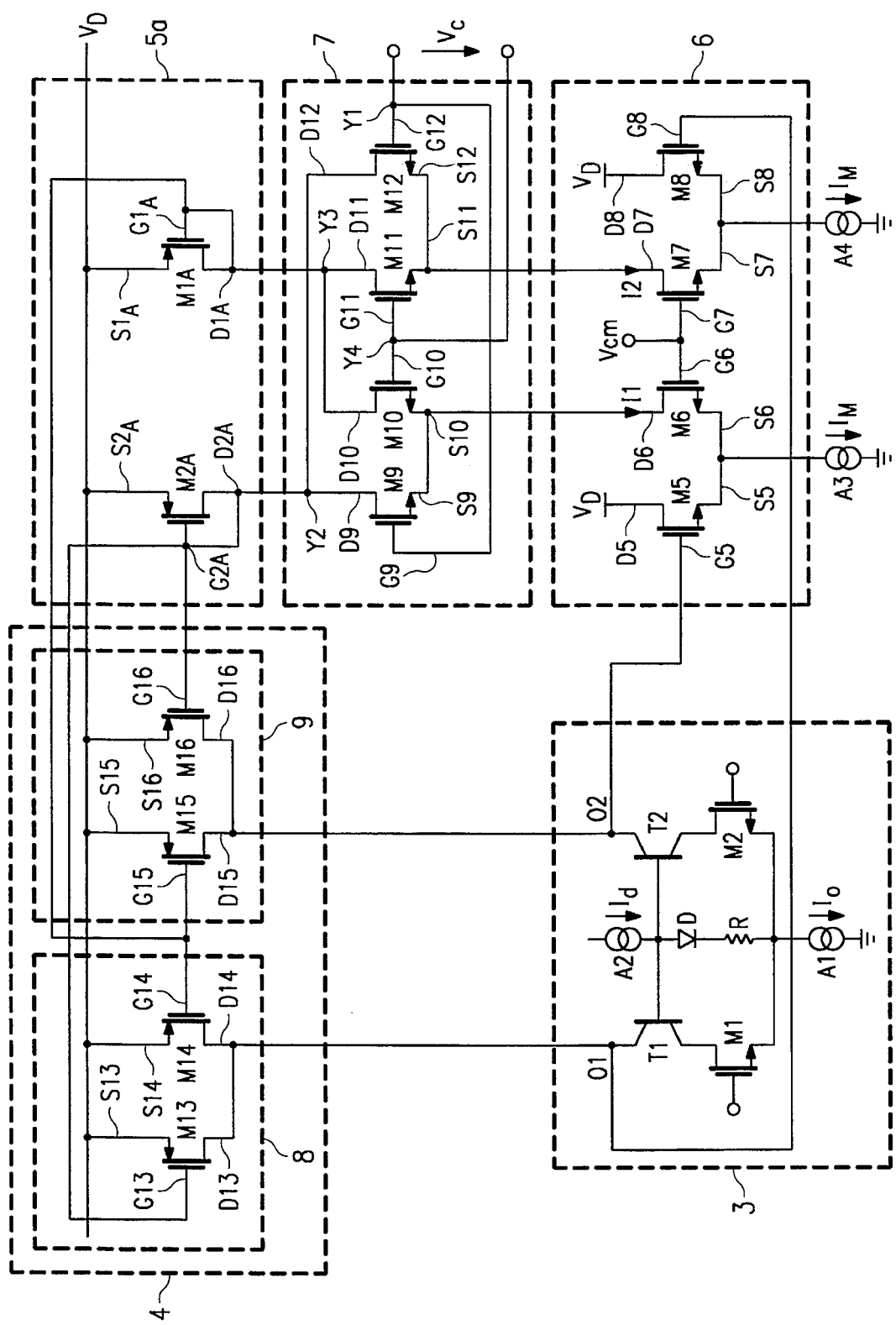
FIG. 7 shows an embodiment of the transconductor in FIG. 5.

A preferred embodiment of the circuit of transconductor 2 is shown in FIG. 7, and comprises a transconductance stage 3 similar to the conventional one, with a feedback circuit 6 for the transconductor common mode signals connected to its output terminals O1 and O2.

The common mode feedback circuit 6 comprises a double differential cell, wherein a first cell comprises a first pair of MOS transistors M5 and M6 of the n-channel type which have their source terminals S5 and S6 in common and connected to a first current generator A3 supplying a current $I_M$.

The first MOS transistor M5 has its gate terminal G5 connected to the output O2 of the transconductance stage 3, while its drain terminal D5 is connected to the supply voltage reference $V_D$.

The second MOS transistor M6 has its gate terminal G6 connected to the gate terminal G7 of a first transistor M7 in a second MOS transistor pair M7 and MS, also of the n-channel type and included to the second cell.

The MOS transistors M7 and M8 have their source terminals S7 and S8, respectively, connected together and to a further current generator A4 which supplies the current $I_M$.

The gate terminal G8 of the second MOS transistor M8 in the second pair is connected to the first output terminal O1 of the transconductance stage 3, the drain terminal D8 being connected to the supply voltage reference $V_D$.

The drain terminals D6 and D7 of the MOS transistors M6 and M7, respectively, are connected to a circuit 7 referred to hereinafter as the DC gain adjustment circuit. The common mode feedback circuit 6 and the adjustment circuit 7 are parts of the control circuit shown at 5 in FIG. 5.

The adjustment circuit 7 comprises a first pair of MOS transistors M9 and M10, and a second pair of MOS transistors M11 and M12, all of the n-channel type.

The transistors M9 and M10 have their source terminals S9 and S10 connected together and to the drain terminal D6 of the MOS transistor M6 included to the common mode feedback circuit 6.

Likewise, the MOS transistors M11 and M12 have their source terminals S11 and S12 connected together and to the drain terminal D7 of the MOS transistor M7 included to the common mode feedback circuit 6.

The MOS transistors M9 and M12 have their gate terminals G9 and G12 connected together to provide a common terminal Y1, and their drain terminals D9 and D12 also connected together to provide a second common terminal Y2.

The MOS transistors M10 and M11 have their drain terminals D10 and D11 connected together to form a third common terminal Y3 and their gate terminals G10 and G11 connected together into a fourth common terminal Y4.

A control voltage Vc is applied between the terminals Y4 and Y1 of the adjustment circuit whose greater potential goes to the terminal Y4.

The terminals Y2 and Y3 are connected to a pair A of MOS transistors $M_{1A}$ and $M_{2A}$ of the p-channel type incorporated to a current mirror portion 5a, in turn included to the control circuit 5.

The gate terminal $G_{1A}$ of the MOS transistor $M_{1A}$ is connected to both of the transistor pairs, 8 and 9, incorporated to the active load 4 of the transconductor. More particularly, the terminal $G_{1A}$ is connected to the gate terminals G14 and G15.

The gate terminal $G_{2A}$ of the MOS transistor $M_{2A}$ is also connected to both of the transistor pairs 8 and 9 incorporated to the active load 4 of the transconductor. In particular, this terminal $G_{2A}$ is connected to the gate terminals G13 and G16.

The pair of p-channel MOS transistors M13 and M14 which form the first load circuit 8 of the active load 4 have their drain terminals D13 and D14 connected to the output terminal O1 of the transconductance stage 3.

The second pair of transistors M15, M16 forming the second load circuit 9 of the active load 4 have their drain terminals D15 and D16 connected to the second output terminal O2 of the transconductance stage 3.

The common mode feedback circuit 6 is selected to have at least the same linearity range for differential signals as the transconductance stage 3.

The operation of the transconductor 2 according to the invention will now be reviewed.

The common mode feedback circuit 6, as shown in FIG. 7, sets the voltages at the output terminals O1 and O2 to a predetermined value Vcm.

Under this condition, the incoming currents $I_1$ and $I_2$ to the MOS transistors M6 and M7 will be:

$$I_1 = I_2 = I_M/2 \quad (15)$$

The sum of the currents which are flowing through the transistors $M_{1A}$ and $M_{2A}$ will therefore be $I_1 + I_2 = I_M$.

By acting on the control voltage Vc, an equivalent drain-source conductance gds can be obtained as given by relation (14) above.

By virtue of the respective current mirror connections of the transistors M13; M16 and M15; M16 in the load circuits 8 and 9 to the MOS transistors $M_{2A}$ and $M_{1A}$ in the portion 5a, the overall active load of the transconductor 2 replicates the equivalent drain-source conductance gds of the transistor pair $M_{1A}$ and $M_{2A}$.

Figure 8:
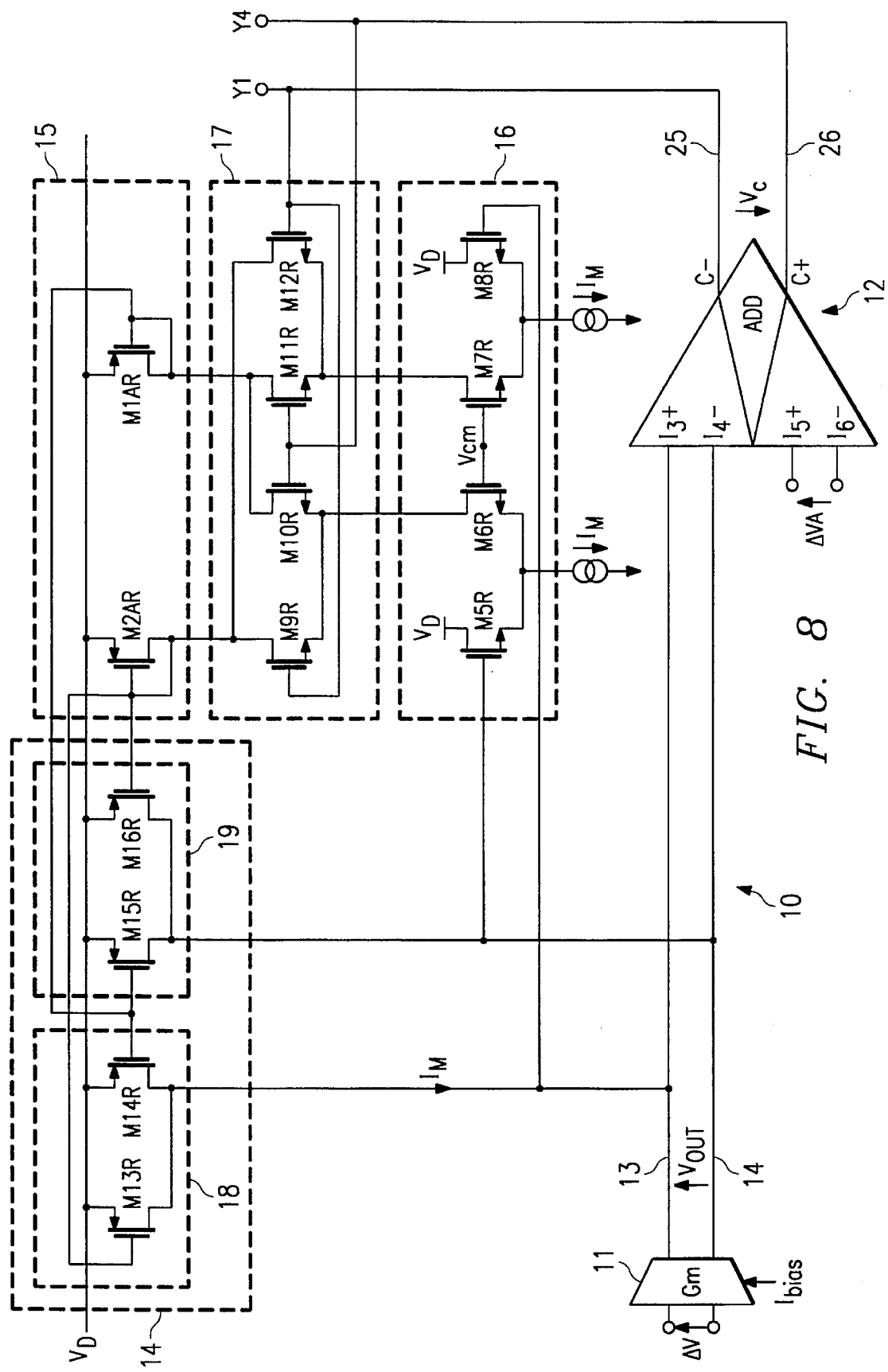
FIG. 8 shows an embodiment of a replica circuit associated with the transconductor of FIG. 5.

The voltage Vc is generated by an appropriate replica circuit 10, shown in FIG. 8.

The bias replica circuit 10 comprises a second transconductance stage 11, being actually a replica of the transconductance stage 3. Note, however, that this stage 11 receives a constant input voltage value ΔV, not a signal voltage.

Load circuits 18 and 19, being replicas of the circuits 8 and 9, form an active load 14, and are respectively connected to outputs 13 and 14 of the transconductance stage 11.

The MOS transistors contained in the replica circuit 10 have been denoted by the same references as the corresponding MOS transistors in the circuit architecture of FIG. 7, with an "R" suffix to indicate their replicated functions. Accordingly, circuit portions 15, 16, 17 are illustrated which fully correspond to the portions 5a, 6, 7.

The circuit 16 can be viewed, similar to circuit 6, as a common mode feedback circuit, and controls the common mode voltage Vcn of the transconductance stage 11.

A potential difference Vout exists between the outputs 13 and 14 of the transconductance stage 11 which will be referred to as the output voltage from the stage.

The replica circuit 10 further comprises a differential amplifier 12 having four inputs I3, I4, I5, I6 and two outputs 25, 26.

Figure 9:
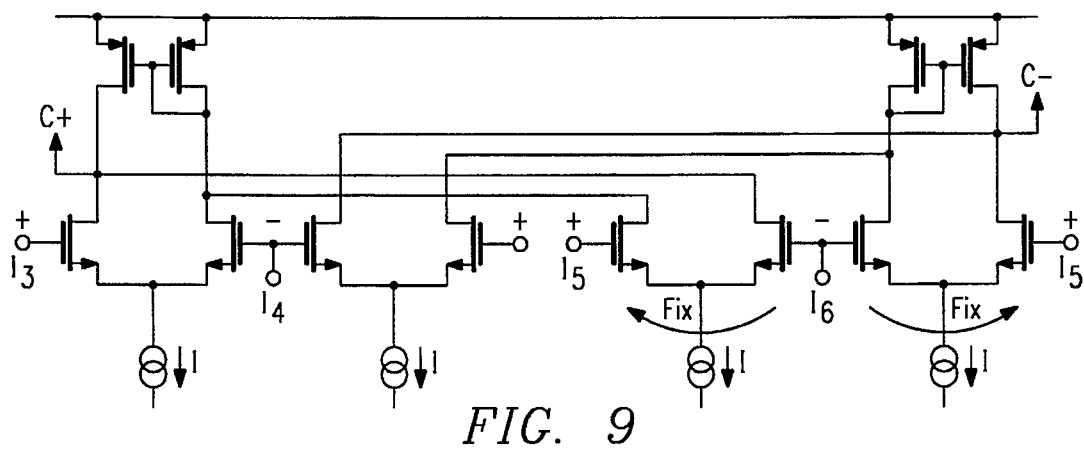
FIG. 9 shows schematically a portion of the replica circuit in FIG. 8.

Shown in FIG. 9 is a circuit embodying said differential amplifier 12 with four inputs.

The inputs I3 and I4 are respectively connected to the outputs 13 and 14 of the transconductance stage 11, while the inputs I5 and I6 receive a constant voltage value equal to ΔV*A, where A is the gain sought.

The output 25 of the differential amplifier 12 is connected to the gate terminals G15R and G16R of MOS transistors M12R and M9R, and the output 26 is connected to the gate terminals G10R and G11R of MOS transistors M10R and M11R.

The difference of the voltage at the output terminal 26 with respect to that at the output terminal 25 generates the control voltage Vc which is then applied across the terminals Y4 and Y1 of the adjustment circuit 7 in FIG. 7.

The DC gain is set by the feedback operational amplifier 12. The loop will be stable when the output voltage Vout from the second transconductance stage 11 equals the value ΔV*A. Thus, the target gain A can be provided.

We claim:

1. A controlled gain transconductor comprising:

a transconductance stage having at least two input terminals and at least two output terminals;

an active load connected to the output terminals of said stage, said active load comprising at least one pair of transistors each having first and second terminals and a control terminal, the first and second terminals of said transistor pair being connected together, and the control terminals being connected to the control circuit; and a control circuit for the active load connected between said output terminals and the active load;

wherein the transistors in said at least one pair are of the p-channel MOS type; and wherein the drain terminals of said MOS transistors are connected to a corresponding output terminal of the transconductance stage.

2. A controlled gain transconductor comprising:

a transconductance stage having at least two input terminals and at least two output terminals;

an active load connected to the output terminals of said stage; and a control circuit for the active load connected between said output terminals and the active load, said control circuit comprising a common-mode signal feedback circuit connected to said output terminals of said transconductance stage, a DC-gain adjustment circuit having an output connected to said feedback circuit, and a current-mirror circuit portion connected between said adjustment circuit and said active load.

3. A transconductor according to claim 2, said common-mode feedback circuit comprising at least one pair of differential cells, each comprised of a pair of transistors with at least one terminal in common and connected to a current generator, the control terminal of a transistor in each pair being connected to a corresponding one of said output terminals of said transconductance stage.

4. A transconductor according to claim 2, said adjustment circuit comprising at least one transistor pair having at least one terminal in common and connected to said common-mode feedback circuit.

5. A controlled gain transconductor comprising:

a transconductance stage having at least two input terminals and at least two output terminals;

an active load connected to the output terminals of said stage; and a control circuit for the active load connected between said output terminals and the active load;

a circuit portion being a replica of said transconductance stage, said active load and said control circuit, which circuit portion has an output connected to the control circuit of the transconductor.

6. A transconductor according to claim 5, said replicated circuit portion comprising a second transconductance stage being a replica of said stage and having a constant voltage applied to its inputs.

7. A transconductor according to claim 5, said replicated circuit portion further comprising a differential amplifier with four inputs and two outputs, the first two inputs of said amplifier being connected to the outputs of the second transconductance stage and the second inputs of the amplifier being applied a constant voltage.

8. A transconductor according to claim 5, the control circuit within said replicated circuit portion comprising a common-mode signal feedback circuit connected to the output terminals of the second transconductance stage, a DC-gain adjustment circuit having its output connected to the feedback circuit, and a current-mirror circuit portion connected between the adjustment circuit and the replicated active load.

9. A transconductor according to claim 7, wherein the outputs of said amplifier are connected to said second adjustment circuit and the control circuit to provide a predetermined voltage value (Vc).

10. A transconductor according to claim 5, wherein said second transconductance stage has a transconductance (Gm) which is regulated by a bias current equal to that supplied to said first transconductance stage.

11. A transconductor according to claim 4, wherein at least one pair of said transistors comprising said adjustment circuit are of the p-channel MOS type.

12. A transconductor according to claim 2, wherein said adjustment circuit has at least one input connected to a control voltage.

13. A transconductor according to claim 2, said common-mode feedback circuit having at least the same linearity range for differential signals as said transconductance stage.

14. A transconductor according to claim 3, wherein at least one pair of said transistors comprising said differential cells are of the p-channel MOS type.

15. A method for controlling the gain of a transconductance stage comprising the steps of:
  accepting a voltage input and deriving a corresponding current output in a transconductance stage;
  loading said output with an active load;
  providing a constant voltage sufficient to control the DC gain of the transconductance stage; and
  varying the output resistance of said active load according to said constant voltage and feedback from said output to achieve the desired gain.

16. A controlled-gain transconductor comprising:
  an input stage;
  a load stage connected to supply a bias current to said input stage;
  a compensating stage connected to said load stage to control the bias of said load stage; and
  a dummy stage connected to said compensating stage to supply an appropriate constant voltage;
  wherein said dummy stage comprises a replica of said input stage, said load stage and said compensating stage, said dummy stage having an output connected to said compensating stage of said transconductor.

17. A transconductor according to claim 16, said dummy stage further comprising a differential amplifier having four inputs and two outputs, the first two inputs of said amplifier being connected to said replicated input stage and the second inputs of said amplifier being applied a constant voltage, the outputs of said differential amplifier connected to said compensating stage.

18. A controlled-gain integrator comprising:
  a transconductance stage having at least two input terminals and at least two output terminals;
  an active load connected to the output terminals of said transconductance stage;
  a control circuit for said active load connected between said output terminals and said active load, said control circuit comprising a common-mode signal feedback circuit connected to said output terminals of said transconductance stage, a DC-gain adjustment circuit having an output connected to said feedback circuit, and a current-mirror circuit portion connected between said adjustment circuit and said active load; and
  an integration circuit connected to said transconductance stage.

19. An integrator according to claim 18, wherein said integration circuit comprises at least one capacitor.

20. An integrator according to claim 18, said common-mode feedback circuit comprising at least one pair of differential cells, each comprised of a pair of transistors with at least one terminal in common and connected to a current generator, the control terminal of a transistor in each pair being connected to a corresponding one of said output terminals of said transconductance stage.

21. An integrator according to claim 18, said adjustment circuit comprising at least one transistor pair having at least one terminal in common and connected to said common-mode feedback circuit.

22. An integrator according to claim 18, further comprising a circuit portion being a replica of said transconductance stage, said active load and said control circuit, which circuit portion has an output connected to the control circuit of the transconductor.

23. A integrator according to claim 22, said replicated circuit portion comprising a second transconductance stage being a replica of said stage and having a constant voltage applied to its inputs.

24. A integrator according to claim 22, said replicated circuit portion further comprising a differential amplifier with four inputs and two outputs, the first two inputs of said amplifier being connected to the outputs of the second transconductance stage and the second inputs of the amplifier being applied a constant voltage.

25. A controlled gain integrator, comprising:
  a transconductance stage having at least two input terminals and two output terminals; and
  a variable load connected to supply a bias current to said output terminals of said transconductance stage;
  a feedback circuit also connected to said output terminals of said conductor stage;
  an adjustment circuit connected to both said feedback circuit and said load circuit to control the bias of said load circuit, said adjustment circuit comprising at least one transistor pair having at least one terminal in common and connected to said feedback circuit; and
  an integration circuit connected to said transconductance stage.

26. A controlled-gain integrator comprising:
  a transconductance stage having at least two input terminals and at least two output terminals;
  an active load connected to the output terminals of said transconductance stage;
  a control circuit for said active load connected between said output terminals and said active load;
  a circuit portion being a replica of said transconductance stage, said active load and said control circuit, which circuit portion has an output connected to the control circuit of the transconductor; and
  an integration circuit connect to said transconductance stage.

27. An integrator according to claim 25, said adjustment circuit comprising at least one transistor pair connected to each other in a current mirror configuration.

28. An integrator according to claim 25, said feedback circuit comprising at least one pair of differential cells, each comprised of a pair of transistors with at least one terminal in common and connected to a current generator, the control terminal of a transistor in each pair being connected to a corresponding one of said output terminals of said transconductance stage.

29. An integrator according to claim 25, wherein said integration circuit comprises at least one capacitor.

30. An integrator according to claim 25, said integrator further comprising a dummy stage connected to said adjustment circuit.

31. An integrator according to claim 30, wherein said dummy stage comprises a replica of said transconductance stage, said variable load, said adjustment circuit, and said feedback circuit, said dummy stage having an output connected to said adjustment circuit of said integrator.

32. An integrator according to claim 31, said dummy stage further comprising a differential amplifier having four inputs and two outputs, the first two inputs of said amplifier being connected said replicated input stage and the second inputs of said amplifier being applied a constant voltage, the outputs of said differential amplifier connected to said adjustment circuit of said integrator.

* * * * *